(12) United States Patent
Flammang et al.

(10) Patent No.: US 8,975,892 B2
(45) Date of Patent: Mar. 10, 2015

(54) METHOD OF OPTIMIZING MAGNETIC RESONANCE IMAGE CONTRAST WITH MRI RELAXATION TIME SCANNING PARAMETERS CORRELATED TO AGE OF A SUBJECT

(75) Inventors: Aaron J. Flammang, Baltimore, MD (US); Christopher Glielmi, Chicago, IL (US); Peter Weale, Menith Wood (GB)

(73) Assignees: Siemens Corporation, Iselin, NJ (US); Siemens Medical Solutions USA, Inc., Malvern, PA (US); Siemens plc (GB)

( * ) Notice: Subject to any disclaimer, the term of this patent is extended or adjusted under 35 U.S.C. 154(b) by 342 days.

(21) Appl. No.: 13/309,710

(22) Filed: Dec. 2, 2011

(65) Prior Publication Data

US 2013/0141092 A1 Jun. 6, 2013

(51) Int. Cl.
*G01R 33/50* (2006.01)
*G01R 33/54* (2006.01)
(52) U.S. Cl.
CPC .............. *G01R 33/543* (2013.01); *G01R 33/50* (2013.01)
USPC ............................. 324/309; 324/307; 324/318
(58) Field of Classification Search
USPC .......................... 324/200–322; 600/407–435; 382/128–131
See application file for complete search history.

(56) References Cited

U.S. PATENT DOCUMENTS

| | | | |
|---|---|---|---|
| 8,731,256 B2 * | 5/2014 | Mori et al. | 382/128 |
| 2006/0153436 A1 | 7/2006 | Haras | |
| 2007/0078330 A1 * | 4/2007 | Haras et al. | 600/407 |
| 2010/0092056 A1 | 4/2010 | Rofsky et al. | |
| 2010/0284595 A1 * | 11/2010 | Mori et al. | 382/131 |
| 2013/0141092 A1 * | 6/2013 | Flammang et al. | 324/309 |

OTHER PUBLICATIONS

M. S. Van Der Knaap and J. Valk, "MR imaging of the various stages of normal myelination during the first year of life", Neuroradiology, 1990, pp. 459-470, vol. 31(6), Springer-Verlag.
Corrado Baratti, Alan S. Barnett, and Carlo Pierpaoli, "Comparative MR Imaging Study of Brain Maturation in Kittens with T1, T2, and the Trace of the Diffusion Tensor", Radiology, Jan. 1999, pp. 133-142, vol. 210.
B. A. Holland, D. K. Haas, D. Norman, M. Brant-Zawadzki, and T. H. Newton, "MRI of normal brain maturation", American Journal of Neuroradiology, 1986, pp. 201-208, vol. 7.
Matt A. Bernstein, Kevin F. King and Xiaohong Joe Zhou, "Handbook of MRI Pulse Sequences", 2004, p. 608-611 and 632-639, Elsevier Academic Press.
R. Grant Steen and Jason Schroeder, "Age-related changes in the pediatric brain: proton T1 in healthy children and in children with sickle cell disease", Magnetic Resonance Imaging, 2003, pp. 9-15, vol. 2, Elsevier.

* cited by examiner

*Primary Examiner* — Melissa Koval
*Assistant Examiner* — Tiffany Fetzner

(57) ABSTRACT

A method (100) that automates the process of selecting parameters for MR imaging acquisition to provide imaging with optimal image contrast.

13 Claims, 4 Drawing Sheets

METHOD OF OPTIMIZING MAGNETIC RESONANCE IMAGE CONTRAST WITH MRI RELAXATION TIME SCANNING PARAMETERS CORRELATED TO AGE OF A SUBJECT

FIELD OF INVENTION

The present invention generally relates to magnetic resonance (MR) imaging. More particularly, the present invention relates to MR imaging that provides optimal image contrast.

BACKGROUND OF THE INVENTION

At present, it is difficult to obtain optimal MR imaging on pediatric patients, especially during the first year of life. One of the main reasons for this difficulty is the process of acquisition parameter selection to produce images of the highest possible diagnostic contrast is highly dependent upon imaging practitioners who may be unaware of appropriate parameter selection. This issue and the underlying processes at work have been well documented in the medical scientific community (see, for example, an article by M. S. van der Knaap and J. Valk, entitled "MR imaging of the various stages of normal myelination during the first year of life", Neuroradiology, 1990, pp 459-470, vol. 31(6), Springer-Verlag).

Thus, age specific optimization of acquisition parameters depends solely on the knowledge of the imaging practitioner. Further, there are no known current systems to provide this type of guidance. At this time, one must rely on the subjective assumptions and experience (which is varying) of imaging practitioners to set appropriate parameters at the time of acquisition. Accordingly, it is highly likely that optimal image contrast is often simply not achieved.

Automation and documentation of this process would be beneficial. The MR imaging acquisition parameters, T2 and T1 relaxation times, would be of particular interest, but it is fair to say that even diffusion based contrast mechanisms could be automated. This is based on work done in kitten models as reported in an article by Corrado Baratti, Alan S. Barnett, and Carlo Pierpaoli, entitled "Comparative MR Imaging Study of Brain Maturation in Kittens with T1, T2, and the Trace of the Diffusion Tensor", Radiology, January 1999, pp. 133-142, vol. 210, which is incorporated by reference herein. Regardless, the largest advantage of an automated, documented approach is that it removes the practitioner's subjectiveness and/or potential lack of experience, and replaces it with a process that utilizes scientifically documented parameter choices.

It is noted that methods that generally relate to automated parameter selection are known. One example is U.S. Patent Publication 2006/0153436 by Gabriel Haras, dated Jul. 13, 2006 and entitled "Method for Determining Acquisition Parameters for a Medical Tomography Device, and an Associated Apparatus." In general, the goal of the described apparatus is to automate certain parameter selection in "Tomographic" imagers, specifically, computed tomographic imagers. Protocol limitations are outlined as well as changes in body habitus as a guide for setting optimal parameters. The described apparatus lends itself to the automation of parameter sets, but more so for x-ray based imaging methods. Additional protocol alterations relate directly to x-ray quantity and quality factors. Imaging of children is discussed, but the scope of parameter adjustment is not broadened to easily incorporate MR-related contrast mechanisms so as to address the above-discussed problem.

Another example is U.S. Patent Publication 2010/0092056 by Neil M. Rofsky and Daniel K. Sodickson, dated Apr. 15, 2010 and entitled "MRI Systems and Related Methods." Many parameters are selected for automation, but the basis for alteration is not described in detail. Furthermore, it appears that the described system relates to future developments in three dimensional imaging and fast scanning techniques. No method to determine appropriate parameter selection for image contrast is discussed therein.

SUMMARY OF THE INVENTION

The aforementioned problems are obviated by the present invention which provides a method of MR imaging, comprising automatically selecting image acquisition parameters that are optimized as a function of age of a subject in order to maximize contrast in MR imaging of the area under examination. The step of automatically selecting may comprise selecting an image acquisition parameter set based on the type of MR imaging of the area under examination or on the user protocol for the MR imaging of the area under examination, and automatically modifying the image acquisition parameter set using MR relaxation times based on the age of the subject. The step of automatically modifying may comprise automatically obtaining expected MR relaxation times of the area under examination based on the age of the subject. Alternatively, the step of automatically modifying may comprise automatically calculating new values of the image acquisition parameter set through the use of Bloch equations. In such case, the image acquisition parameter set may comprise one or more of the following parameters: the repetition time, the inversion time and the echo time.

The present invention also provides an MR imaging system, comprising an imager that images an anatomical area of a subject to acquire image data and a control system that manipulates the acquired image data and stored image data to produce MR images of the anatomical area and that automatically selects image acquisition parameters that are optimized as a function of age of the subject in order to maximize contrast in the MR images of the anatomical area. The control system may automatically extract an image acquisition parameter set from a data storage of the system based on a system user's selection of either the type of MR imaging of the anatomical area or the user protocol for the MR imaging of the anatomical area, and automatically modify the image acquisition parameter set using MR relaxation times based on the age of the subject. Further, the control system may automatically extract expected MR relaxation times of the anatomical area based on the age of the subject from the data storage. Alternatively, the control system may automatically calculate new values of the image acquisition parameter set using an algorithm based on Bloch equations. In such case, the image acquisition parameter set may comprise one or more of the following parameters: the repetition time, the inversion time and the echo time, for T1 weighted, T2 weighted, or proton density images.

The present invention also provides a method of automated protocol optimization to maximize contrast in MR imaging of a subject, comprising automatically obtaining MR signal characteristics, as a function of the age of the subject, from a-priori knowledge of age related changes in the MR signal characteristics and automatically adjusting specific pulse sequence parameters using the age-based MR signal characteristics. The MR signal characteristics may comprise MR relaxation times, T1 and T2. In such case, the adjusting step may comprise calculating adjusted inversion times, TI of the pulse sequence using the following equations:

$$\Delta M = M_{z,a} - M_{z,b} = M_0[(1 - \cos\theta_{inv})(e^{-TI/T1_b} - e^{-TI/T1_a})], \text{ and}$$

$$TI = \frac{\ln\left(\frac{T1_a}{T1_b}\right)}{T1_a - T1_b} T1_a T1_b,$$

where a and b denote two tissues of the subject being imaged; $M_z$ denotes the longitudinal magnetization component; $M_0$ denotes the magnetization vector at equilibrium along the z-axis; $\Delta M$ denotes the difference in signal between tissues a and b; and TI denotes the time when the absolute value of $\Delta M$ reaches a maximum. Alternatively, the adjusting step may comprise calculating adjusted echo times, TE of the pulse sequence using the following equation:

$$S = M_0\left(1 - 2e^{-(TR-\frac{TE}{2})/T1} + e^{-TR/T1}\right)e^{-\left(\frac{TE}{T2}\right)},$$

where $M_0$ denotes the magnetization vector at equilibrium along the z-axis; S denotes the signal at the spin echo for a tissue of the subject being imaged; and the difference between the signals S for each of two tissues of the subject being imaged provides the image contrast in the MR imaging. The method may further comprise performing MR imaging having image contrast based on the age of the subject.

BRIEF DESCRIPTION OF THE DRAWINGS

For a better understanding of the present invention, reference is made to the following description of an exemplary embodiment thereof, and to the accompanying drawings, wherein.

DETAILED DESCRIPTION

Figure 1:
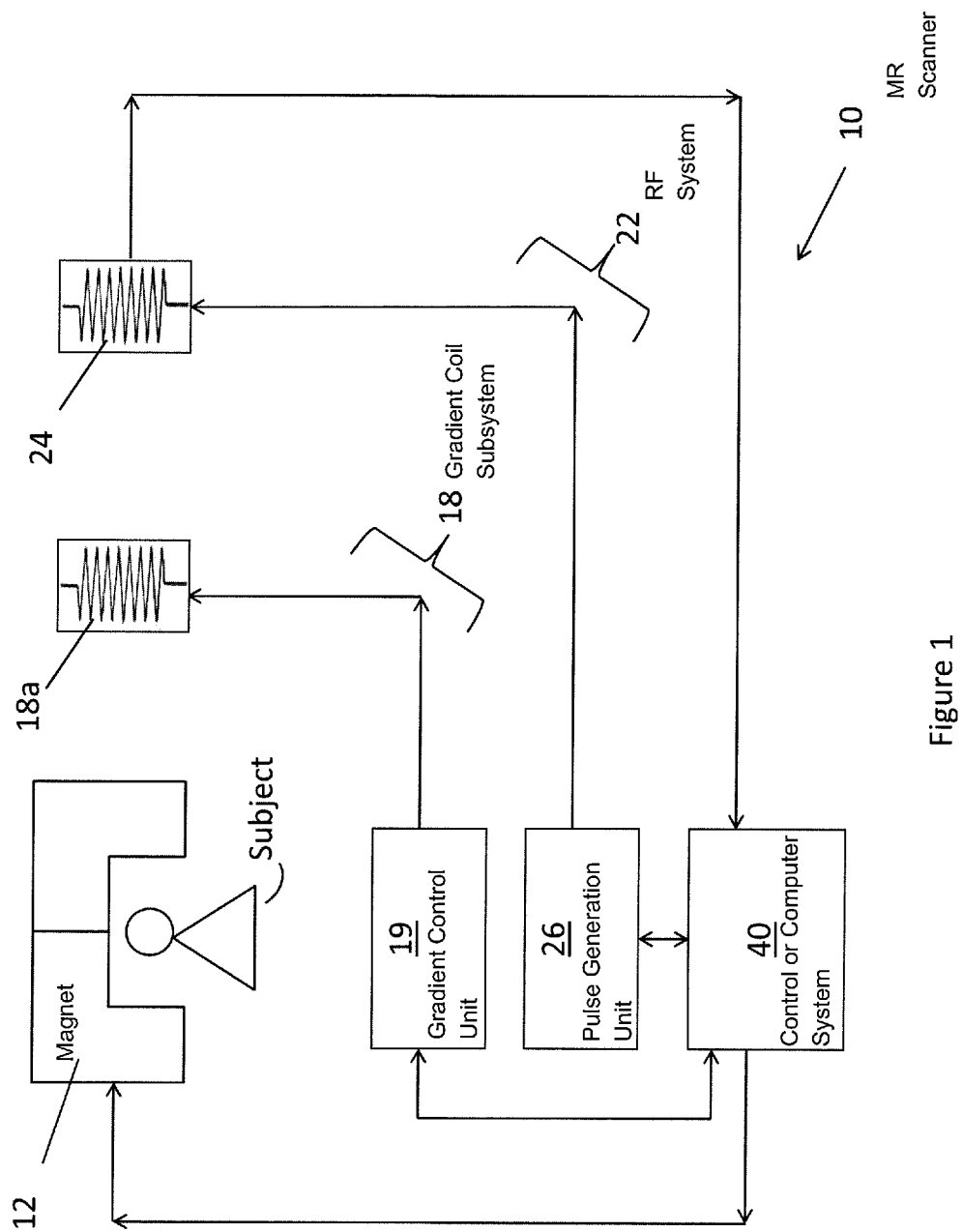
FIG. 1 is a block diagram of an MR imaging scanner that performs MR imaging in accordance with the present invention.

FIG. 1 is a block diagram of an MR imaging scanner 10 (simplified) that performs MR imaging in accordance with the present invention. A main magnet 12 generates a strong static magnetic field in an imaging region where the subject (i.e., patient) is introduced. The magnet 12 is used to polarize the target tissue area under examination, i.e., certain atoms in the target tissue area that were previously randomly-ordered become aligned along the magnetic field. A gradient coil system 18, having a gradient coil subsystem 18a and a gradient coil control unit 19, generates a time-varying linear magnetic field gradient in respective spatial directions, x, y and z, and spatially encodes the positions of the polarized or excited atoms. An RF system 22, having an RF coil subsystem 24 and a pulse generation unit 26, transmits a series of RF pulses to the target cardiac region to excite the "ordered" atoms of the target tissue area. The RF coil subsystem 24 may be adapted to switch between a transmission mode and receiver mode.

A control or computer system 40 coordinates the pulse generation unit 26, the gradient coil control unit 19, and other components to carry out a desired MR image pulse sequence. The scanner 10 repeats the MR image pulse sequence a number of times so the atoms oscillate around the polarized alignment direction (along the main magnetic field) during the excited state caused by the energy of RF pulses. The atoms release the RF energy, i.e., generate an RF signal, during the resonance or oscillation and as the atoms return to their respective alignments. The RF coil subsystem 24 receives or detects the released RF energy and generates spatially-coded MR signals to the computer system 40. It is noted that the subject may be injected with contrast agent that permeates the target tissue area in order to assist in the capture of image data and the resulting image visualization.

Figure 2:
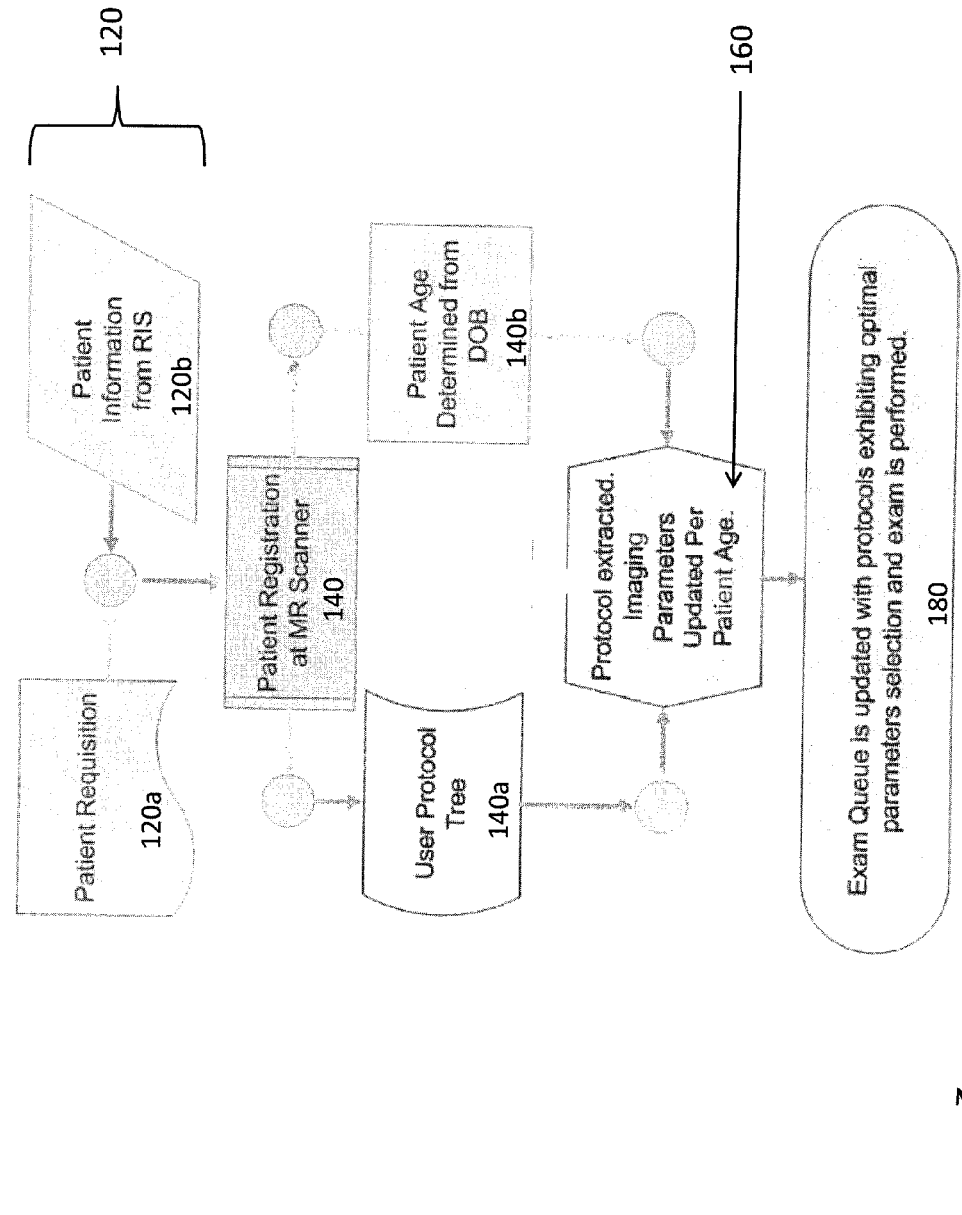
FIG. 2 is a method of optimizing MR imaging protocols carried out in accordance with the present invention.

The computer system 40, which controls the operation of the MR scanner 10 and its components, processes the MR signals to transform them into a visual representation of the target tissue region (i.e., reconstructed MR images) for display, storage, image processing, and/or other usage. The MR scanner 10 and, in particular, the computer system 40, is adapted to permit the scanner 10 to operate and to implement methods of the present invention, for example, as shown in FIG. 2. To this end, the computer system 40 may comprise appropriate components, for example, input/output devices, tangible data storage media, various software, graphical user interfaces, networking devices, etc.

FIG. 2 is a flow chart of a method 100 of optimizing MR imaging protocols carried out in accordance with the present invention. Patient information may be delivered to the MR scanner 10 (Step 120) either manually, e.g., using a patient "requisition form" (Step 120a) or transferring via an appropriate medium pre-existing patient data from a Radiology Information System (RIS) to populate a database "scheduler" on the MR scanner 10 (Step 120b). The imaging practitioner may then register the respective patient with the MR scanner 10 (Step 140) in a semi-automated manner either by manually entering the patient information into the MR scanner 10 database at the time of the MR scan or by confirming the RIS populated scheduler data. The patient information may comprise typical identification and health data, and specifically includes a patient's date of birth. Note that the patient registration step is typically used to draw the limitations of various operating parameters for the MR imaging, for example, the specific absorption rate from patient weight, and is not limited to the proper selection of contrast-related parameters by the method 100.

The patient registration step 140 includes determining relevant patient data (i.e., patient age) (Step 140a) and selecting the type of MR imaging examination for the patient or the "user protocol" for the examination (Step 140b). The particular user protocol may be selected from a "User Protocol Tree" that is typically stored in and accessed through the MR scanner 10. Generally, the MR scanner 10 acts on the patient's registration (and more particularly, the selected protocol) and extracts from appropriate data storage MR imaging parameters for the patient's MR imaging examination. Further, with the method 100, the extracted imaging parameters are updated for the patient's age (Step 160) resulting in changes being made to the MR image pulse sequence parameters that affect image contrast. For example, the patient's age may be used to lookup, from the appropriate data storage, the expected MR relaxation times of the patient tissue under examination. The optimum repetition times (TR), inversion times (TI), and/or echo times (TE) for T1 weighted, T2 weighted, or proton density images are then calculated by use of the well known Bloch equations. An optimized MR imaging parameter set is derived from the calculations and used in the MR imaging protocol where contrast between two tissues (for example, gray matter and white matter in a neuroimaging application) is now maximized. The examination queue is updated with the MR imaging protocols exhibiting optimal parameters selection and the MR imaging examination is performed (Step 180).

The method 100 achieves superior performance by using known and scientifically reliable data to modify existing MR imaging protocol structure for the purpose of achieving optimal image contrast. This is accomplished by requiring only the date of birth of the patient at the time of registration. No other information need be input, nor does the method 100 require significant alteration of the user interface or protocol tree.

Figure 3:
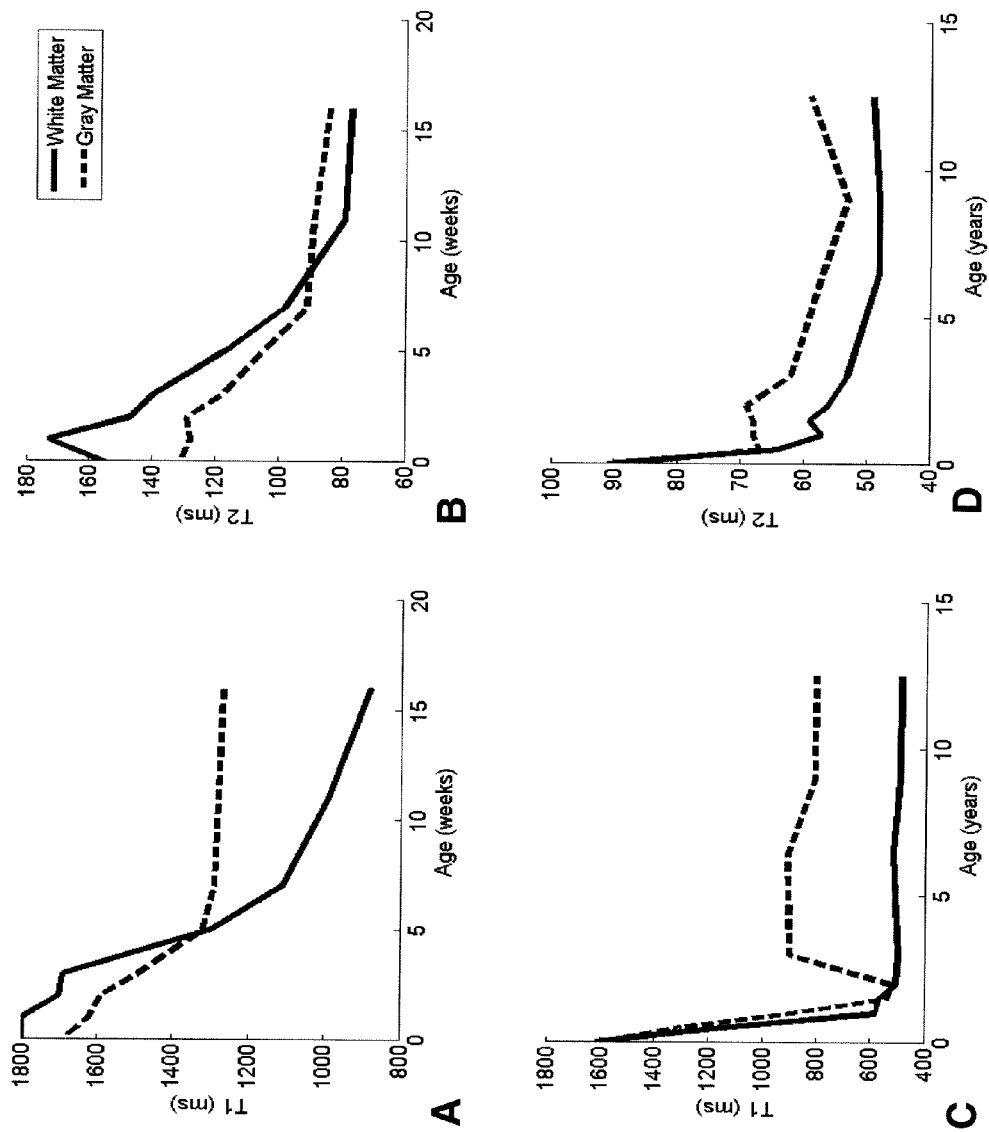
FIG. 3 shows four graphs of approximate changes in the T1 and T2 relaxation parameters during normal brain maturation for gray matter and white matter.

The rationale for age specific optimization of acquisition parameters may be more clearly understood from FIG. 3. FIG. 3 illustrates four graphs that show approximate changes in the T1 and T2 relaxation parameters (in ms) during normal brain maturation for gray matter (dotted line) and white matter (solid line). Graphs A and B are for kitten data over weeks and Graphs C and D are for human data over years. Both sets of graphs show significant variability particularly at the respective young ages. The basis for Graphs A and B is the Baratti article referenced above and the basis for Graphs C and D is an article by B. A. Holland, D. K. Haas, D. Norman, M. Brant-Zawadzki, and T. H. Newton, entitled "MRI of normal brain maturation", American Journal of Neuroradiology, 1986, pp 201-208, vol. 7, which is incorporated by reference herein. Gray matter and white matter have different T1 and T2 values as a function of age, so image contrast (which has T1 and T2 values as intrinsic factors) between these two tissues will also vary with age. The method 100 automatically selects image acquisition parameters in order to maximize contrast between gray and white matter and, specifically, uses patient age and, in turn, age-specific T1 and T2 values to optimize contrast by modifying acquisition parameters for MR imaging of the target tissue area.

Simulations of age-specific gray/white matter contrast optimization as a function of MR imaging parameters demonstrate the method 100 and the principle of the present invention. In brief, the simulations use known equations and age-specific T1 and T2 values (shown in FIG. 3) to maximize contrast by changing a given acquisition parameter, TI or TE. The "optimal" TI or TE maximizes contrast for a given age and is calculated using age-specific T1 and T2 values. The simulations are summarized below. Note that the simulations are conducted in a neuroimaging application although the present invention is not limited to neuroimaging applications.

Figure 4:
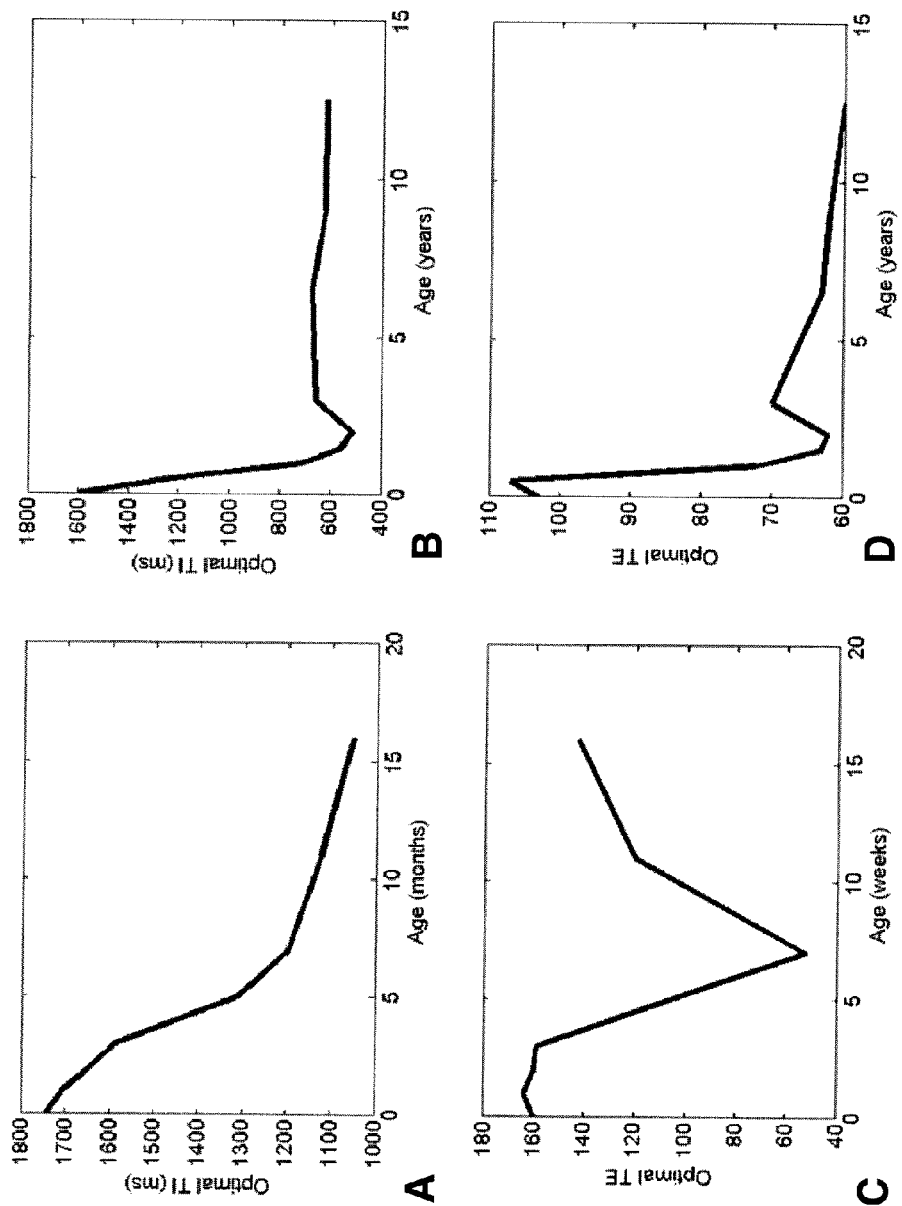
FIG. 4 shows four graphs of the results of simulations of optimized parameters as a function of age.

The first simulation addresses maximizing contrast for T1-weighted imaging. To demonstrate that age-specific relaxation values (T1 and T2) can affect the optimal TI for maximal gray/white matter contrast, an inversion recovery spin echo sequence was simulated using Bloch equations for each age and a range of TI values (this is described further in a book by Matt A. Bernstein, Kevin F. King and Xiaohong Joe Zhou, entitled "Handbook of MRI Pulse Sequences", 2004, pages 608-611 and 632-639 Elsevier Academic Press, which is incorporated by reference herein). FIG. 4 illustrates four graphs that show the results of simulations of optimized parameters as a function of age. Specifically, Graphs A and B show TI selection for T1-weighted spin echo acquisition in kittens (Graph A) and in humans (Graph B). Note that the basis for Graph A is the Baratti article referenced above and the basis for Graph B is the Holland article referenced above. For kitten data over the initial 16 weeks life and human data over the initial 2 years of life, optimal TI decreases as a function of age. For this simulation, the age of the registered patient would be used to automatically determine and select the TI that maximizes contrast between gray and white matter.

The second simulation addresses maximizing contrast for T2-weighted imaging. To demonstrate that age-specific relaxation values (T1 and T2) can affect the optimal TE for maximal gray/white matter contrast, a T2-weighted spin echo sequence was simulated with T2-weighting resulting from relatively long TR and TE (this is described further in the Bernstein book referenced above). Similar to T1-weighted simulations, optimal TE for maximal contrast is dependent on T1 and T2 relaxation values. Due to age-varying relaxation parameters, optimal TE is age-dependent. FIG. 4, Graphs C and D show TE selection for T2-weighted spin echo acquisition in kittens (Graph C) and in humans (Graph D). Note that the basis for Graph C is the Baratti article referenced above and the basis for Graph D is the Holland article referenced above. For kitten data, optimal TE first decreases over weeks 4-7 before increasing again until 16 weeks (FIG. 4, Graph C). This volatility can be attributed in part to higher gray matter T2 values relative to white matter values after age 7 weeks (shown in FIG. 3, Graph B). Simulations using human relaxation values demonstrate a general decrease in TE with increasing age (FIG. 4, Graph D). Similar to the previously described T1-weighted simulation, the appropriate database of relaxation values would be referenced during patient registration to determine and select the optimal TE maximizing gray/white matter contrast for this type of sequence.

The following describes further details of the simulations. As noted above, FIG. 4, Graphs A and B show the optimal TI to maximize contrast at each age for kitten data (Graph A) and human data (Graph B). A visual comparison of the graphs shows a similar trend over the approximately first 1.5 years of life for the two datasets. The graphs were plotted using a simulated inversion recovery spin echo sequence in which it is assumed that TR>>T1. The gray matter/white matter contrast is optimized using the following equations from the Bernstein book referenced above (equations 14.37 and 14.38):

$$\Delta M = M_{z,a} - M_{z,b} = M_0[(1 - \cos\theta_{inv})(e^{-TI/T1_b} - e^{-TI/T1_a})], \text{ and}$$

$$TI = \frac{\ln\left(\frac{T1_a}{T1_b}\right)}{T1_a - T1_b} T1_a T1_b,$$

where a and b denote the two tissues being compared, i.e., the gray matter and white matter in this case; $M_z$ denotes the longitudinal magnetization component; $M_0$ denotes the magnetization vector at equilibrium along the z-axis, i.e., at time=0; and $\Delta M$ denotes the difference in signal between tissues a and b (gray and white matter). The second equation calculates when the absolute value of $\Delta M$ reaches a maximum This difference in signal, or contrast between tissues, is related to inversion time of a sequence (TI), as well as the longitudinal relaxation (T1) of each tissue, which has been shown to be age-specific. Each point on a graph uses the age-specific T1 values for gray and white matter which is the reason that optimal TI is related to age.

FIG. 4, Graphs C and D show the optimal TE to maximize contrast at each age for kitten data (Graph C) and human data (Graph D). The graphs show different trends over the approximately first 1.5 years of life for the two datasets. The graphs were plotted using a simulated T2-weighted spin echo sequence in which it is assumed that TE is long and TR is long. The gray matter/white matter contrast is optimized using the following equation from the Bernstein book referenced above (equation 14.57):

$$S = M_0\left(1 - 2e^{-(TR-\frac{TE}{2})/T1} + e^{-TR/T1}\right)e^{-\left(\frac{TE}{T2}\right)},$$

where $M_0$ denotes the magnetization vector at equilibrium along the z-axis, i.e., at time=0 and S denotes the signal at the spin echo. The difference between the signals S for each of the two tissues, gray matter and white matter, provides the image contrast. This difference in signal, or contrast between tissues, is related to echo time of a sequence (TE), as well as the transverse relaxation (T2) of each tissue, which has been shown to be age-specific. Each point on a graph uses the age-specific T2 values for gray and white matter which is the reason that optimal TE is related to age.

Advantageously, the method 100 provides a process for the selection of MR imaging parameters to deliver optimal image contrast, especially through the use of documented and proven data. Also, the method 100 automates the process of selecting optimal parameters for MR imaging acquisition in tissues with known age related dependence.

Further, the method 100 does not require creating an entirely new graphical user interface for the MR scanner 10 or significantly altering the entire user graphical interface or user protocol structure. The method 10 compels an imaging practitioner to interact with the interface and input several examination goals or outcomes and, thus, establishes a graphical user interface that is "goal oriented". Further, the method 100 may be implemented as a software option and may improve both existing and new equipment offerings through simple integration in a modern MR imaging graphical user interface.

Other modifications are possible within the scope of the invention. For example, the subject patient to be scanned may be a human subject, animal subject or any other suitable object. Also, although the steps of the method 100 have been described in a specific sequence, the order of the steps may be re-ordered in part or in whole and the steps may be modified, supplemented, or omitted as appropriate. Also, the method 100 may use various well known algorithms and software applications to implement the steps and substeps. Further, the method 100 may be implemented in a variety of algorithms and software applications. Further, the method 100 may be supplemented by additional steps or techniques. It is also understood that the method 100 may carry out all or any of the steps using real-time data, stored data from a data archive or database, data from a remote computer network, or a mix of data sources.

Also, the various described instrumentation and tools are conventional and well known. They may be configured and interconnected in various ways as necessary or as desired. Further, although in the described method 100 the user may use self-contained instrumentation and tools, the user may use other instrumentation or tools in combination with or in place of the instrumentation and tools described for any step or all the steps of the method 100, including those that may be made available via telecommunication means. Further, the described method 100, or any steps, may be carried out automatically by appropriate instrumentation and tools or with some manual intervention.

What is claimed is:

1. A method of magnetic resonance [MR] imaging, comprising:

receiving age data pertaining to a subject that is to be scanned by a magnetic resonance imaging system prior to performing a magnetic resonance imaging scan;

automatically selecting, with a magnetic resonance control or computer system, image acquisition parameters including MR relaxation times; and optimizing, with the magnetic resonance control or computer system, the automatically selected MR relaxation times as a function of the received age data pertaining to the subject, in order to maximize image contrast in one or more MR imaging scans of the subject, with respect to the area of the subject under examination; and performing a magnetic resonance imaging scan with the magnetic resonance imaging system, in order to generate and display, MR images of the subject with the optimal maximized image contrast of the area under examination.

2. The method of claim 1, wherein the step of automatically selecting, with a magnetic resonance control or computer system, comprises selecting an image acquisition parameter set based on a specific type of MR imaging being performed on the area under examination, or selecting an image acquisition parameters set based on a user protocol, that has been selected by the user specifically for the MR imaging of the area of the subject under examination.

3. The method of claim 1, wherein the step of optimizing the automatically selected MR relaxation times comprises automatically calculating new values of an image acquisition parameter set through the use of Bloch equations.

4. The method of claim 3, wherein the image acquisition parameter set comprises one or more of the following image acquisition parameters: the repetition time, the inversion time and the echo time.

5. A magnetic resonance (MR) imaging system, comprising:

an imager that images an anatomical area of a subject in order to acquire image data: and a control system that manipulates both acquired image data and stored image data in order for the control system to produce MR images of the anatomical area:

wherein the control system automatically selects image acquisition parameters including MR relaxation times that are optimized as a function of a received age of the subject, before the MRI imager acquires the image data of the anatomical area of the subject being imaged by the imager in order to maximize image contrast in the resulting MR images of the anatomical area of the subject, after the imager, performs a magnetic resonance imaging acquisition on the anatomical area of the subject.

6. The magnetic resonance imaging system of claim 5, wherein the control system;

automatically extracts an image acquisition parameter set from a data storage of the magnetic resonance imaging system based on an MRI system user's selection of either:

a type of MR imaging being performed on the anatomical area, or on a specific user protocol, selected specifically by the user for performing the MR imaging of the anatomical area of the subject, and subsequently the control system also automatically modifies the extracted image acquisition parameter set in order to use MR relaxation times based on the age of the subject.

7. The magnetic resonance imaging system of claim 6, wherein the control system automatically extracts expected MR relaxation times, of the anatomical area, based on the age of the subject from the data storage as part of the image acquisition parameter set.

8. The magnetic resonance imaging system of claim 6, wherein control system automatically calculates new values of the image acquisition parameter set using an algorithm based on Bloch equations.

9. The magnetic resonance imaging system of claim 8, wherein the image acquisition parameter set comprises one or more of the following parameters:
 a repetition time, an inversion time and an echo time, which results in T1 weighted, T2 weighted, or proton density images after the imager, performs a magnetic resonance imaging acquisition on the anatomical area of the subject.

10. A method of magnetic resonance (MR) automated protocol optimization in order to maximize image contrast in magnetic resonance (MR) imaging of a subject, comprising
 automatically obtaining, with a magnetic resonance control or computer system, MR signal characteristics, as a function of the age of the subject, from a-priori knowledge of age related changes in the MR signal characteristics; and
 automatically adjusting and optimizing, with the magnetic resonance control or computer system, one or more specific magnetic resonance relaxation time pulse sequence parameters using the age of the subject-based MR signal characteristics in order to maximize the image contrast; and
 performing a magnetic resonance imaging scan with a magnetic resonance imaging system in order to generate and display MR images of the subject with the optimally maximized image contrast based on the age of the subject.

11. The method of claim 10, wherein the magnetic resonance relaxation time pulse sequence parameters comprise MR, T1 and T2 relaxation times.

12. The method of claim 11, wherein the adjusting step comprises calculating adjusted inversion times, TI of the pulse sequence using the following equations:

$$\Delta M = M_{z,a} - M_{z,b} = M_0[(1 - \cos\theta_{inv})(e^{-TI/T1_b} - e^{-TI/T1_a})], \text{ and}$$

$$TI = \frac{\ln\left(\frac{T1_a}{T1_b}\right)}{T1_a - T1_b} T1_a T1_b,$$

where a and b denote two tissues of the subject being imaged;

$M_z$ denotes the longitudinal magnetization component;

$M_0$ denotes the magnetization vector at equilibrium along the z-axis;

$\Delta M$ denotes the difference in signal between tissues a and b; and

TI denotes the time when the absolute value of $\Delta M$ reaches a maximum.

13. The method of claim 11, wherein the adjusting step comprises calculating adjusted echo times, TE of the pulse sequence using the following equation:

$$S = M_0\left(1 - 2e^{-(TR-\frac{TE}{2})/T1} + e^{-TR/T1}\right)e^{-\left(\frac{TE}{T2}\right)},$$

where $M_0$ denotes the magnetization vector at equilibrium along the z-axis;

S denotes the signal at the spin echo for a tissue of the subject being imaged; and the difference between the signals S for each of two tissues of the subject being imaged provides the image contrast in the MR imaging.

* * * * *